United States Patent [19]
Ikuina et al.

[11] Patent Number: 5,757,062
[45] Date of Patent: May 26, 1998

[54] CERAMIC SUBSTRATE FOR SEMICONDUCTOR DEVICE

[75] Inventors: Kazuhiro Ikuina; Mitsuru Kimura, both of Tokyo, Japan

[73] Assignee: NEC Corporation, Tokyo, Japan

[21] Appl. No.: 823,042

[22] Filed: Mar. 21, 1997

Related U.S. Application Data

[63] Continuation of Ser. No. 351,536, Dec. 7, 1994, abandoned.

[30] Foreign Application Priority Data

Dec. 16, 1993 [JP] Japan .................................. 5-316205
Sep. 27, 1994 [JP] Japan .................................. 6-231755

[51] Int. Cl.$^6$ .................................................. H01L 29/43
[52] U.S. Cl. .......................... 257/537; 257/751; 257/762; 257/767
[58] Field of Search .......................... 257/537, 762, 257/767, 751

[56] References Cited

U.S. PATENT DOCUMENTS

| | | | |
|---|---|---|---|
| 4,503,090 | 3/1985 | Brown et al. | 427/96 |
| 4,635,026 | 1/1987 | Takeuchi | 338/22 SD |
| 4,675,644 | 6/1987 | Ott et al. | 338/21 |
| 4,695,504 | 9/1987 | Watanabe et al. | 428/209 |
| 4,795,670 | 1/1989 | Nishigaki et al. | 428/209 |
| 4,831,432 | 5/1989 | Hori et al. | 257/43 |
| 4,863,510 | 9/1989 | Tamemasa et al. | 75/0.5 A |
| 4,899,126 | 2/1990 | Yamada | 338/309 |
| 4,985,377 | 1/1991 | Iseki et al. | 501/51 |
| 5,264,272 | 11/1993 | Tanabe et al. | 428/209 |
| 5,427,853 | 6/1995 | Powell et al. | 428/357 |

FOREIGN PATENT DOCUMENTS

| | | |
|---|---|---|
| 0324555 | 7/1989 | European Pat. Off. |
| 0453858 | 10/1991 | European Pat. Off. |
| 0226156 | 11/1985 | Japan |
| 60-253107 | 12/1985 | Japan |
| 1-136302 | 5/1989 | Japan |
| 1-158136 | 11/1989 | Japan |
| 4-342101 | 11/1992 | Japan |
| 5205903 | 8/1993 | Japan |
| 59-75603 | 4/1994 | Japan |

*Primary Examiner*—Tom Thomas
*Assistant Examiner*—David B. Hardy
*Attorney, Agent, or Firm*—Sughrue, Mion, Zinn, Macpeak & Seas, PLLC

[57] ABSTRACT

A ceramic substrate for use with a semiconductor device, includes an electrical conductor composed of Ag, a resistor composed of oxide, and a barrier layer located between the electrical conductor and the resistor and composed of a material selected from a group consisting of AgPd and AgPt. The ceramic substrate prevents a diffusion of Ag atoms between the electrical conductor and the resistor, and hence provides a stable internal resistance.

16 Claims, 3 Drawing Sheets

CERAMIC SUBSTRATE FOR SEMICONDUCTOR DEVICE

This is a Continuation of application Ser. No. 08/351,536 filed Dec. 7, 1994, now abandoned.

BACKGROUND OF THE INVENTION

1. Field of the Invention

The invention relates to a substrate composed of ceramic, on which a high speed LSI element is to be mounted and which has an internal resistor.

2. Description of the Prior Art

These days, with a requirement of the down-sizing, lightening, multi-functioning and highly-densifying of a computer and a communication device, it is also required to highly integrate a semiconductor chip and down-size electronic parts. In particular, it is required to improve a packaging technique for electrically connecting the chip or parts with each other. For instance, a resistor has conventionally been mounted on a substrate, but a new method has recently been developed in which a resistor is formed in a substrate for mounting a larger number of parts such as resistors and electrical conductors in a smaller area.

One of such methods includes the steps of forming an electrically conductive layer composed of Ag or AgPd on a green sheet by means of a screen-printing process, and depositing the thus fabricated green sheets, and then firing the deposited green sheets at the temperature in the range of 800 to 900 degrees centigrade.

However, Ag atoms have a tendency to easily diffuse. Thus, Ag atoms in electrical conductors diffuse in a resistor at the temperature in the range of 800 to 900 degrees centigrade, and accordingly there is posed a problem that a resistance value presented by a resistor remains quite unstable. To solve this problem, for instance, Japanese Unexamined Patent Public Disclosure No. 59-75603 has suggested a resistor being shaped to be concave at a longitudinally middle portion to thereby increase a resistance at the longitudinally middle portion which is not affected by a diffusion of Ag atoms. Japanese Unexamined Patent Public Disclosure No. 60-253107 has suggested forming an intermediate layer composed of an alloy including Pd, Ru, Ni, Au and Co, for preventing a diffusion of Ag atoms. Japanese Unexamined Patent Public Disclosure No. 1-136302 has suggested a resistive layer disposed between an Ag electrode and an $RuO_2$ resistor and having no Ag atoms which have a resistivity one-tenth smaller than that of the $RuO_2$ resistor. According to the Disclosure, the resistive layer can stop a diffusion of Ag atoms. However, the Disclosure does not specify a material of which the resistive layer is to be made. Japanese Unexamined Patent Public Disclosure No. 4-342101 has suggested to mix non-electrically conductive glass and organic vehicle in an electrically conductive material such as $RuO_2$ to thereby reduce a diffusion of Ag atoms into a resistor.

If a content of Pd in an electrical conductor is increased for reducing a diffusion of Ag atoms, a resistance of the electrical conductor is increased. This is not preferable for achieving a high speed performance of a semiconductor device. In addition, the cost for applying a paste is increased.

Japanese Unexamined Utility Model Public Disclosure No. 1-158136 has suggested forming a layer composed of AgPd or AgPt between an Au electrode and an Ag electrode for preventing a diffusion of Ag atoms. Though this Disclosure seems to have a similar structure to the later mentioned invention, the Disclosure aims at preventing a diffusion of Ag atoms between metal and metal. It is impossible to prevent a diffusion of Ag atoms by merely forming such an alloy layer. The invention intends to prevent a diffusion of Ag atoms between metal and metallic oxide by utilizing an alloy having the tendency that an alloy is difficult to be oxidized. Thus, the above mentioned Disclosure is quite different from the later mentioned invention.

The above mentioned prior art has problems as mentioned below, and hence problems which are posed when an Ag conductor and an oxide resistor are used are remain not yet resolved.

Japanese Unexamined Patent Public Disclosure No. 59-75603 attempts to stabilize a resistance value only by controlling a width of a resistor, but cannot prevent a diffusion of Ag atoms at all. Thus, there remains unresolved a problem that as times go by, a resistance value varies by gradual diffusion of Ag atoms. The intermediate layer suggested in Japanese Unexamined Patent Public Disclosure No. 60-253107 tends to increase a resistance of a conductor too much, and hence it is difficult to achiever a high speed performance of a semiconductor device. Japanese Unexamined Patent Public Disclosure No. 4-342101 mixes a resistor with a glass and so on, and hence it is quite difficult to control a resistance value.

SUMMARY OF THE INVENTION

It is an object of the present invention to provide a substrate which reduces the instability of a resistor generated due to a diffusion of Ag atoms, and thereby increases the reliability of the resistor.

The invention provides a ceramic substrate for use with a semiconductor device, the substrate including an electrical conductor composed of Ag, a resistor composed of oxide, and a barrier layer Located between the electrical conductor and the resistor and composed of a material selected from a group consisting of AgPd and AgPt.

The invention also provides a ceramic substrate for use with a semiconductor device, the substrate including an electrical conductor composed of a material selected from a group consisting of AgPd and AgPt, a resistor composed of oxide, and a barrier layer located between the electrical conductor and the resistor and composed of a material selected from a group consisting of AgPd and AgPt. The barrier layer includes Ag in lower weight percent than that of the electrical conductor.

In a preferred embodiment, the electrical conductor includes Pd or Pt in the range of 5% or less by weight on the basis of the weight of the electrical conductor composed of AgPd or AgPt.

In another preferred embodiment, the oxide is selected from a group consisting of $RuO_2$, $IrO_2$ and $RhO_2$.

In still another preferred embodiment, the barrier layer is formed by sintering a paste layer including particles of AgPd or AgPt being coated with $SiO_2$ film.

In yet another preferred embodiment, the $SiO_2$ film is ultra-thin.

In still yet another preferred embodiment, the barrier layer is formed by screen-printing a paste of AgPd or AgPt on the electrical conductor.

In further preferred embodiment, the barrier layer includes Ag in the range of 60% to 90% by weight on the basis of the weight of the barrier layer.

In further preferred embodiment, the ceramic substrate has a multi-layer structure.

The invention also provides a ceramic substrate for use with a semiconductor device, including a repeated structure. The repeated structure includes: an electrical conductor composed of Ag and disposed on a later mentioned second barrier layer; a first barrier layer composed of a material selected from a group consisting of AgPd and AgPt, and disposed on the electrical conductor; a resistive layer composed of oxide and disposed on the first barrier layer; and a second barrier layer composed of a material selected from a group consisting of AgPd and AgPt, and disposed on the resistive layer.

As an alternative to the above mentioned structure, the repeated structure may include an electrical conductor composed of a material selected from a group consisting of AgPd and AgPt, and disposed on a later mentioned second barrier layer; a first barrier layer composed of a material selected from a group consisting of AgPd and AgPt, and disposed on the electrical conductor, the first barrier layer including Ag in lower weight percent than that of the electrical conductor; a resistive layer composed of oxide and disposed on the first barrier layer; and a second barrier layer composed of a material selected from a group consisting of AgPd and AgPt, and disposed on the resistive layer.

The invention is characterized by a barrier layer for preventing a diffusion of Ag atoms, located between an electrical conductor having a high content of Ag which tends to diffuse, and a resistor. The barrier layer is composed of AgPd or AgPt. It should be noted that the content of Ag in the barrier layer is required to be lower than the content of Ag in the electrical conductor. This is because, if the barrier layer has a higher content of Ag than the electrical conductor, Ag atoms present in the barrier layer diffuse into the resistor, and accordingly the barrier layer provides no advantages.

In the barrier layer composed of AgPd or AgPt, AgPd or AgPt particles become an alloy while the ceramic substrate is being sintered. Thus, a diffusion of Ag atoms is advantageously prevented relative to a structure wherein an Ag electrode is directly connected to a resistor. This is because Ag atoms are quite difficult to be oxidized if they become an alloy.

Furthermore, the barrier layers may be formed by sintering a paste layer including particles of AgPd or AgPt which are coated with ultra-thin $SiO_2$ film. $SiO_2$ included in the $SiO_2$ film extremely decreases a diffusion speed of Ag atoms while maintaining electrical conductivity of the barrier layer composed of AgPd or AgPt. Since a resistance of the barrier layer is lower than that of $RuO_2$, it does not deleteriously affect a high speed performance of the ceramic substrate.

It should be noted that the barrier layer may be formed of AgPd or AgPt for each of electrical conductors composed of AgPd and AgPt.

The advantage obtained by the present invention is as follows. The invention provides a stable internal resistance in a glass ceramic multi-layer substrate including a resistor therein, by forming a layer for preventing a diffusion of Ag atoms between the electrical conductor and the resistor.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

EMBODIMENT 1

Figure 3:
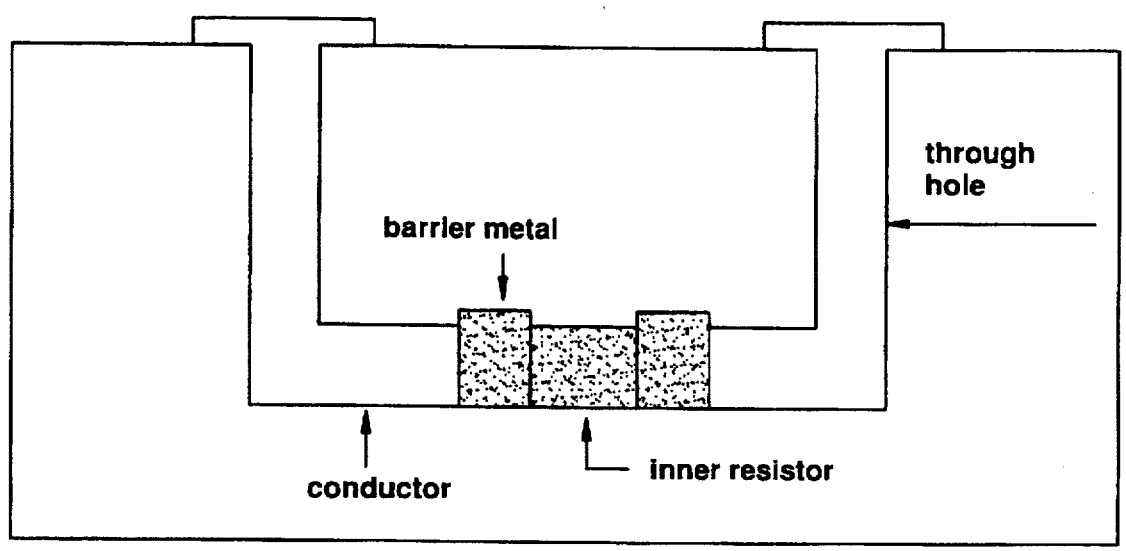
FIG. 3 is a schematic view illustrating the cross-section of an internal resistor of a ceramic substrate.

A multi-layer substrate in accordance with a first embodiment is formed by means of a green sheet manufacturing process. First, aluminum oxide (alumina) powder is screened to obtain particles having the size ranging from 0.8 to 1.2 micrometers, and similarly borosilicate glass powder is screened to obtain particles having the size ranging from 1 to 3 micrometers. Then, the particles of aluminum oxide and borosilicate glass are mixed with each other so that each of them occupy 50% by weight of the mixture. Then, the mixture is further mixed with an organic vehicle into a slurry phase. Then, a green sheet 1 having a desired thickness is manufactured by a slip-casting process, and subsequently through holes are formed, as shown in FIG. 3. The holes are filled with a paste, and a pattern of electrical conductor 2 is printed on the green sheet 1.

A paste with which the electrical conductor 2 pattern is printed on the green sheet 1 is composed of Ag, AgPd or AgPt. A specific resistance of a sintered conductor is required to be less than 10 $\mu\Omega$.cm, because if the specific resistance is larger than 10 $\mu\Omega$.cm, there can be obtained no merit of alumina multi-layer substrate including electrical conductors composed of tungsten (W) having a specific resistance in the range of approximately 10 to 20 $\mu\Omega$.cm. Accordingly, when an electrical conductor is to be composed of AgPd or AgPt, the electrical conductor is required to include Pd or Pt in the range of 5% or less by weigh on the basis of the weight of the electrical conductor.

After a pattern of the electrical conductor 2 has been formed, a paste of AgPd or AgPt is screen-printed on the electrical conductor 2 to thereby form a barrier layer 3. As mentioned earlier, the weight percent of Ag in the barrier layer 3 has to be lower than that of the electrical conductor 2. The lower the weight percent of Ag in the barrier layer, the more effectively the diffusion of Ag atoms is prevented. However, if the content of Pd or Pt is raised, the cost would be increased and also a resistance of the barrier layer 3 could not be disregarded. Hence, the weight percent of Ag in the barrier layer 3 is preferably in the range of 60 to 90%.

Then, a resistive paste is applied on the barrier layer 3 to thereby form a resistive layer 4. Further, on the resistive layer 4 is deposited a second barrier layer 3A, and a second electrical conductor pattern 3B is formed on the second barrier layer 3A so that a barrier layer is located between a resistive layer and an electrical conductor. After repeating this step to thereby form a laminated structure, the resultant structure is sintered at the temperature in the range of 800 to 900 degrees centigrade.

Figure 1:
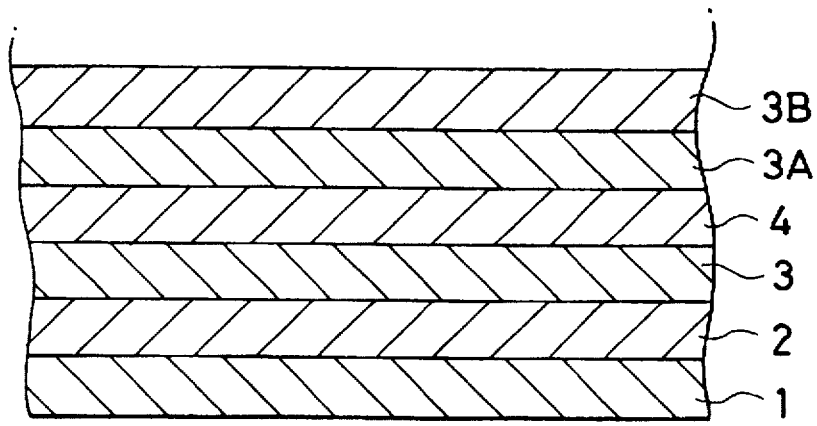
FIG. 1 is a schematic view illustrating a structure of a ceramic substrate in accordance with the invention.
Figure 2:
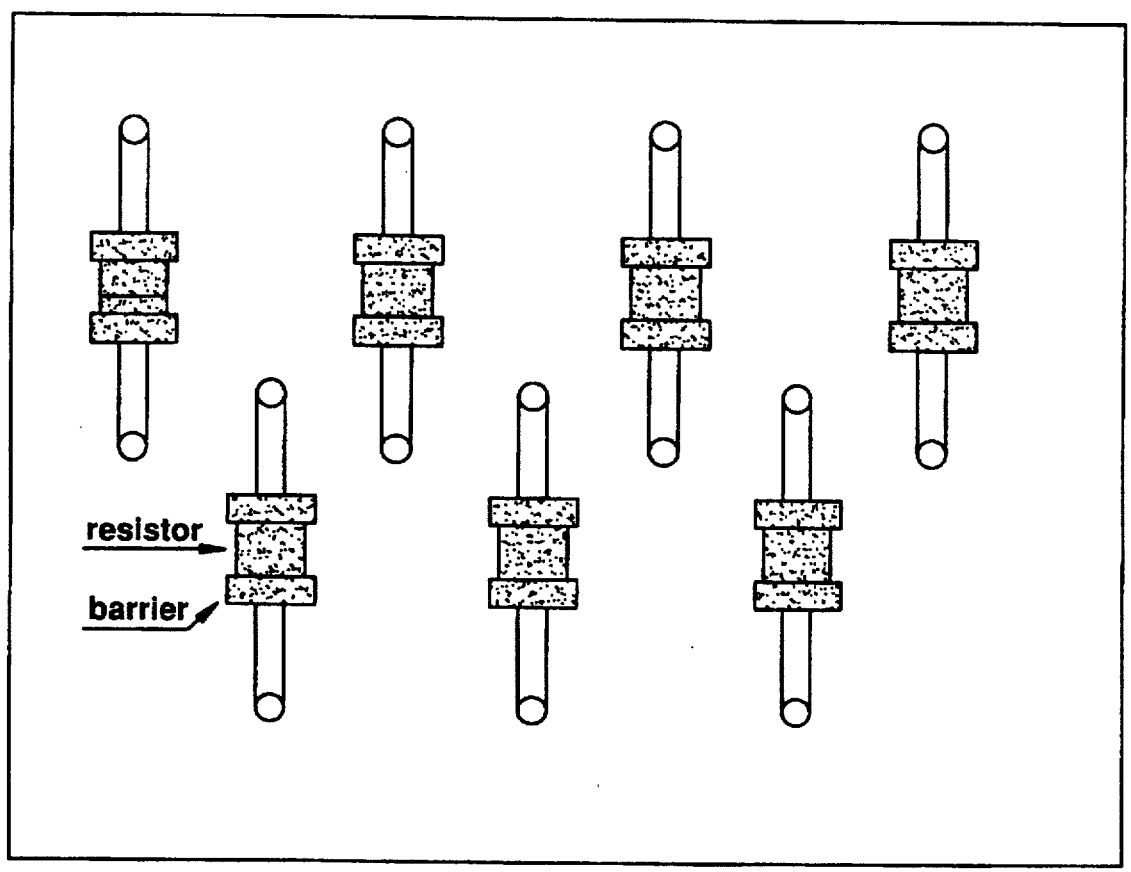
FIG. 2 is a schematic view illustrating a structure of a ceramic substrate having seven internal resistors printed on a green sheet.

The thus manufactured multi-layer substrate is cut by 100 mm ×100 mm. Then, seven internal resistors are formed in the 100 mm×100 mm substrate, as shown in FIG. 2. An experiment, in which actual resistance values of the seven internal resistors were measured, was conducted to confirm the advantageous effects of the invention. The results are shown in Table 1 in which T-1 to T-7 indicates each of the seven resistors. All the resistors have 50Ω of a resistance. It should be noted that a resistor which can be practically used is one having 50=20Ω of a resistance.

TABLE 1

UNIT: RESISTOR Ω
CONDUCTOR wt %
BARRIER LAYER wt %

| NO. | CONDUCTOR | BARRIER LAYER | RESISTOR | T-1 | T-2 | T-3 | T-4 | T-5 | T-6 | T-7 |
|---|---|---|---|---|---|---|---|---|---|---|
| 1 | Ag(100) | NOTHING | $RuO_2$ | 115 | 61 | 35 | 42 | 190 | 21 | 84 |
| 2 | Ag(100) | AgPd(90/10) | $RuO_2$ | 62 | 53 | 48 | 38 | 66 | 38 | 55 |
| 3 | Ag(100) | AgPd(80/20) | $RuO_2$ | 68 | 49 | 32 | 32 | 60 | 44 | 61 |
| 4 | Ag(100) | AgPd(60/40) | $RuO_2$ | 53 | 49 | 46 | 51 | 51 | 48 | 52 |
| 5 | Ag(100) | NOTHING | $IrO_2$ | 183 | 99 | 84 | 65 | 173 | 41 | 21 |
| 6 | Ag(100) | AgPd(90/10) | $IrO_2$ | 61 | 70 | 56 | 45 | 65 | 49 | 48 |
| 7 | Ag(100) | NOTHING | $RhO_2$ | 143 | 74 | 94 | 35 | 91 | 38 | 94 |
| 8 | Ag(100) | AgPd(90/10) | $RhO_2$ | 65 | 70 | 51 | 48 | 62 | 49 | 46 |
| 9 | AgPd(95/5) | NOTHING | $RuO_2$ | 162 | 94 | 95 | 21 | 32 | 26 | 105 |
| 10 | AgPd(95/5) | AgPd(92/8) | $RuO_2$ | 142 | 105 | 33 | 101 | 83 | 51 | 22 |
| 11 | AgPd(95/5) | AgPt(90/10) | $RuO_2$ | 62 | 53 | 48 | 50 | 49 | 36 | 52 |
| 12 | AgPd(95/5) | AgPt(70/30) | $RuO_2$ | 50 | 48 | 49 | 50 | 53 | 48 | 47 |

The following can be confirmed from Table 1.

1. If the barrier layer would be formed, a dispersion of a resistance is larger than ±20Ω.
2. If the content of Ag in the electrical conductor is larger than the content of Ag in the barrier layer, a dispersion of a resistance is larger than ±20Ω.

EMBODIMENT 2

In a second embodiment, when a paste of AgPd or AgPt is manufactured, organic silicate is additionally mixed with particles of AgPd or AgPt and organic vehicle, and then the mixture is mixed by means of three rolls. The organic silicate is oxidized while the substrate is being sintered, and thereby forms an ultra-thin $SiO_2$ oxide layer around the particles of AgPd or AgPt. Then, the same experiment as the first embodiment was conducted. The results are shown in Table 2.

TABLE 2

UNIT: RESISTOR Ω
CONDUCTOR wt %
BARRIER LAYER wt %

| NO. | CONDUCTOR | BARRIER LAYER | RESISTOR | T-1 | T-2 | T-3 | T-4 | T-5 | T-6 | T-7 |
|---|---|---|---|---|---|---|---|---|---|---|
| 1 | Ag(100) | AgPd(90/10) | $RuO_2$ | 51 | 49 | 47 | 46 | 53 | 48 | 55 |
| 2 | Ag(100) | AgPd(80/20) | $RuO_2$ | 46 | 50 | 51 | 49 | 50 | 48 | 52 |
| 3 | Ag(100) | AgPd(60/40) | $RuO_2$ | 51 | 49 | 47 | 52 | 50 | 49 | 51 |
| 4 | Ag(100) | AgPd(90/10) | $IrO_2$ | 52 | 50 | 46 | 51 | 48 | 49 | 50 |
| 5 | Ag(100) | AgPd(90/10) | $RhO_2$ | 46 | 51 | 51 | 49 | 47 | 49 | 53 |
| 6 | AgPd(95/5) | AgPt(90/10) | $RuO_2$ | 49 | 53 | 47 | 50 | 51 | 46 | 52 |
| 7 | AgPd(95/5) | AgPt(70/30) | $RuO_2$ | 46 | 49 | 47 | 54 | 51 | 48 | 49 |

It was confirmed from Table 2 that a diffusion of Ag atoms is further prevented more than in the first embodiment, and that a dispersion of a resistance of the seven resistors can be decreased to less than ±10Ω by coating AgPd or AgPt particles present in the barrier layer with $SiO_2$.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A ceramic substrate for use with a semiconductor device, said substrate comprising:
   an electrical conductor composed of Ag;
   a resistor composed of one oxide selected from the group consisting of $RuO_2$, $IrO_2$ and $RhO_2$; and
   a barrier layer comprising a sintered paste layer comprising particles selected from the group consisting of AgPd and AgPt, wherein said particles are coated with an $SiO_2$ film,
   wherein said barrier layer comprises Ag in an amount of 60% to 90% by weight on the basis of the weight of said barrier layer, and wherein said barrier layer is located between said electrical conductor and said resistor.

2. The ceramic substrate as recited in claim 1, wherein said ceramic substrate further comprises:
   a second barrier layer disposed on said resistor, and
   a second electrical conductor disposed on said second barrier layer.

3. The ceramic substrate as recited in claim 1, wherein said paste layer further comprises an organic silicate.

4. A ceramic substrate for use with a semiconductor device, said substrate comprising:
   an electrical conductor composed of a material selected from the group consisting of AgPd and AgPt;
   a resistor composed of one oxide selected from the group consisting of $RuO_2$, $IrO_2$ and $RhO_2$; and a barrier layer comprising a sintered paste layer comprising particles selected from the group consisting of AgPd and AgPt wherein said particles are coated with an $SiO_2$ film, wherein said barrier layer includes Ag in a lower weight percent than a weight percent of Ag in said electrical conductor, said barrier layer being located between said electrical conductor and said resistor.

5. The ceramic substrate as recited in claim 4, wherein said electrical conductor comprising a material selected from the group consisting of AgPd and AgPt comprises Pd respectively, in the range of 5% or less by weight on the basis of the weight of said electrical conductor.

6. The ceramic substrate as recited in claim 4, wherein said barrier includes Ag in the range of 60% to 90% by weight on the basis of the weight of said barrier layer.

7. The ceramic substrate as recited in claim 4, wherein said ceramic substrate further comprises:

a second barrier layer disposed on said resistor, and a second electrical conductor disposed on said second barrier layer.

8. The ceramic substrate as recited in claim 4, wherein said paste layer further comprises an organic silicate.

9. A ceramic substrate for use with a semiconductor device, said substrate comprising a repeated structure comprising:

a second electrical conductor comprising a material selected from the group consisting of AgPd and AgPt disposed on a second barrier layer;

a first barrier layer comprising a material selected from the group consisting of AgPd and AgPt disposed on a first electrical conductor, wherein said first barrier layer includes Ag in a lower weight percent than a weight percent of Ag in said first electrical conductor;

a resistive layer composed of one oxide selected from the group consisting of $RuO_2$, $IrO_2$ and $Rho_2$ disposed on said first barrier layer; and said second barrier layer composed of a material selected from the group consisting of AgPd and AgPt, and disposed on said resistive layer, wherein at least one of said first and second barrier layers comprises a sintered paste layer comprising particles selected from the group consisting of AgPd and AgPt, wherein said particles are coated with an $SiO_2$ film.

10. A ceramic substrate for use with a semiconductor device, said substrate comprising:

an electrical conductor composed of Ag;

a resistor composed of one oxide selected from the group consisting of $RuO_2$, $IrO_2$ and $RhO_2$; and a barrier layer comprising a screen-printed paste comprising an organic silicate and a material selected from the group consisting of AgPd and AgPt on said electrical conductor, wherein said barrier layer comprises Ag in an amount of 60% to 90% by weight on the basis of the weight of said barrier layer, and wherein said barrier layer is located between said electrical conductor and said resistor.

11. The ceramic substrate as recited in claim 10, wherein said ceramic substrate further comprises:

a second barrier layer disposed on said resistor, and a second electrical conductor disposed on said second barrier layer.

12. A ceramic substrate for use with a semiconductor device, said substrate comprising:

an electrical conductor composed of a material selected from the group consisting of AgPd and AgPt;

a resistor composed of one oxide selected from the group consisting of $RuO_2$, $IrO_2$ and $RhO_2$; and a barrier layer formed by screen-printing a paste comprising an organic silicate and a material selected from the group consisting of AgPd and AgPt on said electrical conductor, said barrier layer including Ag in a lower weight percent than a weight percent of Ag in said electrical conductor, and said barrier layer being located between said electrical conductor and said resistor.

13. The ceramic substrate as recited in claim 12, wherein said electrical conductor comprising a material selected from the group consisting of AgPd and AgPt comprises Pd or Pt, respectively, in the range of 5% or less by weight on the basis of the weight of said electrical conductor.

14. The ceramic substrate as recited in claim 12, wherein said barrier includes Ag in the range of 60% to 90% by weight on the basis of the weight of said barrier layer.

15. The ceramic substrate as recited in claim 12, wherein said ceramic substrate further comprises:

a second barrier layer disposed on said resistor, and a second electrical conductor disposed on said second barrier layer.

16. A ceramic substrate for use with a semiconductor device, said substrate comprising a repeated structure comprising:

a second electrical conductor comprising a material selected from the group consisting of AgPd and AgPt disposed on a second barrier layer;

a first barrier layer formed by screen-printing a paste comprising an organic silicate and a material selected from the group consisting of AgPd and AgPt on a first electrical conductor, wherein said first barrier layer includes Ag in a lower weight percent than a weight percent of Ag in said first electrical conductor;

a resistive layer composed of one oxide selected from the group consisting of $RuO_2$, $IrO_2$ and $RhO_2$ disposed on said first barrier layer; and said second barrier layer composed of a material selected from the group consisting of AgPd and AgPt, and disposed on said resistive layer.

* * * * *

UNITED STATES PATENT AND TRADEMARK OFFICE
CERTIFICATE OF CORRECTION

PATENT NO.   : 5,757,062
DATED        : May 26, 1998
INVENTOR(S)  : Ikuina

It is certified that error(s) appears in the above-identified patent and that said Letters Patent is hereby corrected as shown below:

Column 7, line 37, delete "Rho$_2$" and insert --RhO$_2$--.

Signed and Sealed this

Twentieth Day of October, 1998

Attest:

BRUCE LEHMAN

Attesting Officer

Commissioner of Patents and Trademarks